US012615054B1

(12) United States Patent
Namboodiri et al.

(10) Patent No.:     US 12,615,054 B1
(45) Date of Patent:       Apr. 28, 2026

(54) SAMPLING METHODS AND SYSTEMS

(71) Applicant: Alphacore, Inc., Tempe, AZ (US)

(72) Inventors: Sachin Namboodiri, Tempe, AZ (US);
Phaneendra Bikkina, Tempe, AZ (US)

(73) Assignee: Alphacore, Inc., Tempe, AZ (US)

( * ) Notice: Subject to any disclaimer, the term of this
patent is extended or adjusted under 35
U.S.C. 154(b) by 0 days.

(21) Appl. No.: 19/272,621

(22) Filed: Jul. 17, 2025

(51) Int. Cl.
H03M 1/12         (2006.01)
G06F 1/12         (2006.01)
G11B 20/10         (2006.01)
(52) U.S. Cl.
CPC ............ H03M 1/1245 (2013.01); G06F 1/12
(2013.01); G11B 20/10018 (2013.01)
(58) Field of Classification Search
CPC . H03M 1/1245; H03M 1/12; G11B 20/10018;
G06F 1/10

USPC .......................................... 341/155, 161, 159
See application file for complete search history.

(56)                References Cited

U.S. PATENT DOCUMENTS 9,000,962  B1 *    4/2015  Leuciuc  .............. H03M 1/0836
                                                        341/120
2018/0083638  A1 *    3/2018  Tajalli  ................... H03L 7/0995
2021/0409032  A1 *    12/2021  Bal  ..................... H03M 1/0836

* cited by examiner

*Primary Examiner* — Peguy Jean Pierre
(74) *Attorney, Agent, or Firm* — LOZA & LOZA, LLP

(57)                ABSTRACT

Embodiments of a sampling system and a method for
sampling are disclosed. In an embodiment, a sampling
system includes sampling cells, the sampling cells are dis-
tributed into sampling channels, and the sampling cells in
the sampling channels are driven by sampling clock pulses
with respective phase offsets.

19 Claims, 8 Drawing Sheets

GENERATE SAMPLING CLOCK PULSES WITH RESPECTIVE PHASE OFFSETS

802

DRIVE SAMPLING CELLS DISTRIBUTED IN SAMPLING CHANNELS USING THE SAMPLING CLOCK PULSES TO CAPTURE AND STORE ANALOG VALUES AT DISCRETE TIME INTERVALS

804

SAMPLING METHODS AND SYSTEMS

BACKGROUND

With advancements in technology, there is an increasing demand for systems capable of capturing high-speed signals with minimal power consumption and cost. Conventional high-speed analog-to-digital converters (ADCs) are often constrained by power requirements, complexity, and physical area. Therefore, there is a need for sampling technology that can provide reliable and power efficient high-speed signal acquisition.

SUMMARY

Embodiments of a sampling system and a method for sampling are disclosed. In an embodiment, a sampling system includes sampling cells, the sampling cells are distributed into sampling channels, and the sampling cells in the sampling channels are driven by sampling clock pulses with respective phase offsets. Other embodiments are also described.

In an embodiment, the sampling cells are evenly distributed into the sampling channels, and each of the sampling channels contains an identical number of sampling cells.

In an embodiment, all sampling cells in each of the sampling channels are driven by a sampling clock pulse with a specific phase offset of the sampling clock pulses.

In an embodiment, the sampling cells are configured to capture and store analog values at discrete time intervals.

In an embodiment, one of the sampling cells includes a sampling switch, a capacitor, a buffer, a readout switch, and a delay cell.

In an embodiment, each of the sampling cells includes a sampling switch, a capacitor, a buffer, a readout switch, and a delay cell.

In an embodiment, the sampling switch and the capacitor are configured to capture and store analog data, and the readout switch and the buffer are configured to read the stored analog data.

In an embodiment, the delay cells in all sampling cells in each of the sampling channels are configured to propagate one of the sampling clock pulses sequentially.

In an embodiment, each of the sampling cells is configured to operate in one of a sampling mode and a readout mode.

In an embodiment, data that is read out from the sampling channels is sequentially arranged in one of an analog domain and a digital domain.

In an embodiment, the sampling system further includes a clock circuit configured to generate the sampling clock pulses with the respective phase offsets.

In an embodiment, the clock circuit includes an interpolator configured to generate the respective phase offsets for the sampling clock pulses.

In an embodiment, the interpolator is further configured to generate the respective phase offsets that are tunable to adjust timing delays between the sampling channels.

In an embodiment, a multi-channel sampling system includes sampling cells, where the sampling cells are evenly distributed into sampling channels such that each of the sampling channels contains an identical number of sampling cells, and where the sampling cells in the sampling channels are driven by sampling clock pulses with respective phase offsets, and a clock circuit configured to generate the sampling clock pulses with the respective phase offsets, where all sampling cells in each of the sampling channels are driven by a sampling clock pulse with a specific phase offset of the sampling clock pulses.

In an embodiment, the sampling cells are configured to capture and store analog values at discrete time intervals.

In an embodiment, each of the sampling cells includes a sampling switch, a capacitor, a buffer, a readout switch, and a delay cell.

In an embodiment, the sampling switch and the capacitor are configured to capture and store analog data, and the readout switch and the buffer are configured to read the stored analog data.

In an embodiment, data that is read out from the sampling channels is sequentially arranged in one of an analog domain and a digital domain.

In an embodiment, the clock circuit includes an interpolator configured to generate the respective phase offsets for the sampling clock pulses that are tunable to adjust timing delays between the sampling channels.

In an embodiment, a method for sampling involves generating sampling clock pulses with respective phase offsets and driving sampling cells distributed in sampling channels using the sampling clock pulses to capture and store analog values at discrete time intervals.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
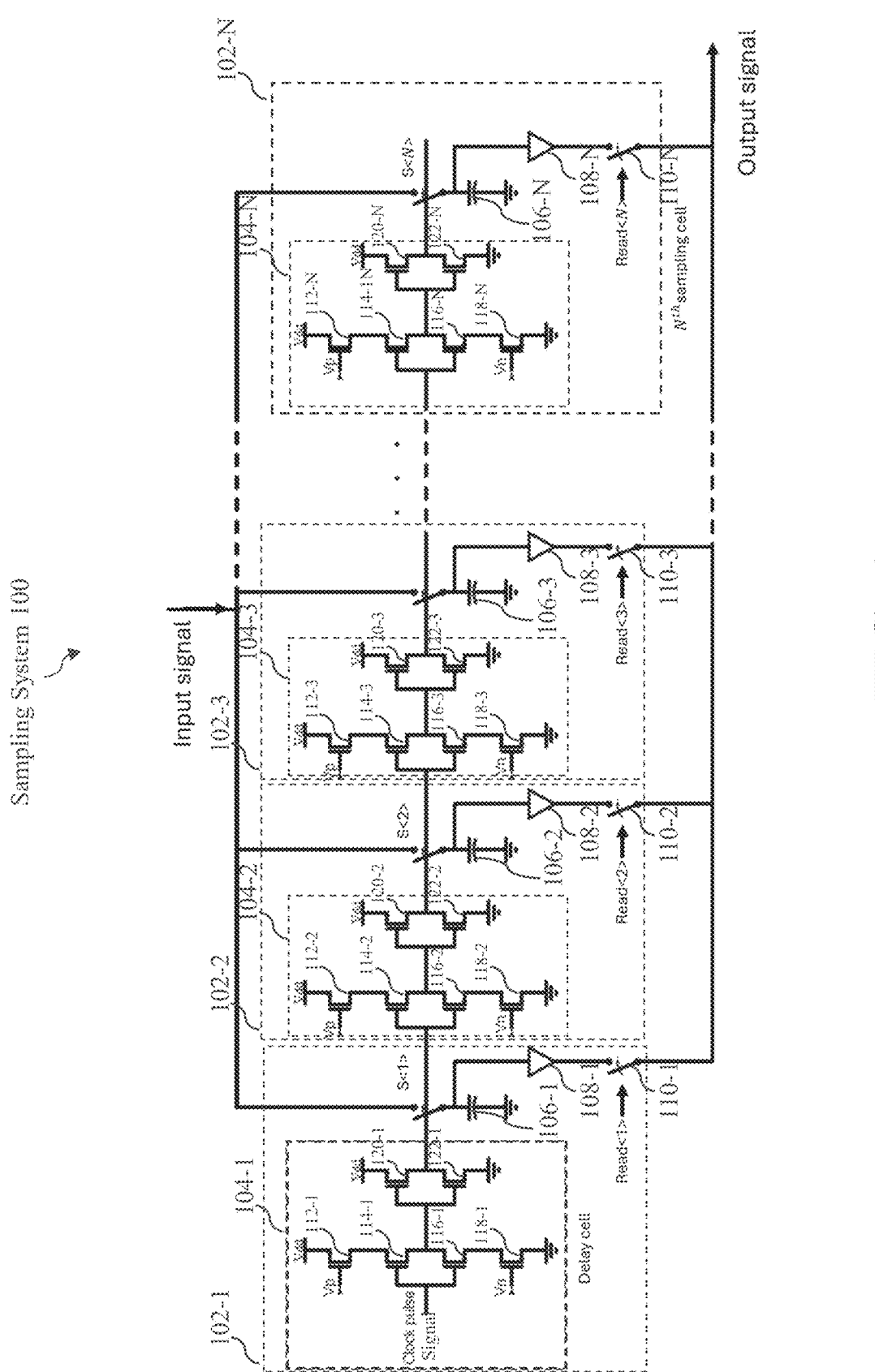
FIG. 1 depicts a sampling system with an array of high-speed samplers and memory buffers/delay cells.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Conventional high-speed signal acquisition technologies are often constrained by power requirements, complexity, and physical area. An alternative approach involves the use of fast transient digitizers, which employ an array of high-speed samplers and memory buffers to sample and store analog signals efficiently. The stored data can subsequently be read at a lower speed, reducing the need for high-speed data processing systems and reducing overall system complexity and power consumption.

FIG. 1 depicts a sampling system 100 with an array of high-speed samplers and memory buffers/delay cells. As depicted in FIG. 1, the sampling system 100 includes a sampler array with N (N being a positive integer) sampling cells 102-1, . . . , 102-N. Each of the sampling cells 102-1, . . . , 102-N includes a sampling switch S<1>, . . . , or S<N>, a capacitor 106-1, . . . , or 106-N, a buffer 108-1, . . . , or 108-N, a readout switch 110-1, . . . , or 110-N, and a delay cell 104-1, . . . , or 104-N. The sampling switches S<1>, . . . , S<N> are controlled by the array of delay cells 104-1, . . . , 104-N. Specifically, each of the sampling switches S<1>, . . . , S<N> is controlled by or through a corresponding delay cell 104-1, . . . or 104-N. Each of the delay cells 104-1, . . . , 104-N includes inverter cells that are connected in a cascaded manner and formed by corresponding transistors 112-1, or 112-N, 114-1, . . . , or 114-N, 116-1, . . . , or 116-N, 118-1, . . . , or 118-N, 120-1, . . . , or 120-N, and 122-1, . . . , or 122-N, and a time delay $t_d$ introduced by these inverters determines the delay of the delay cells 104-1, . . . , 104-N.

Figures 2A, 2B:
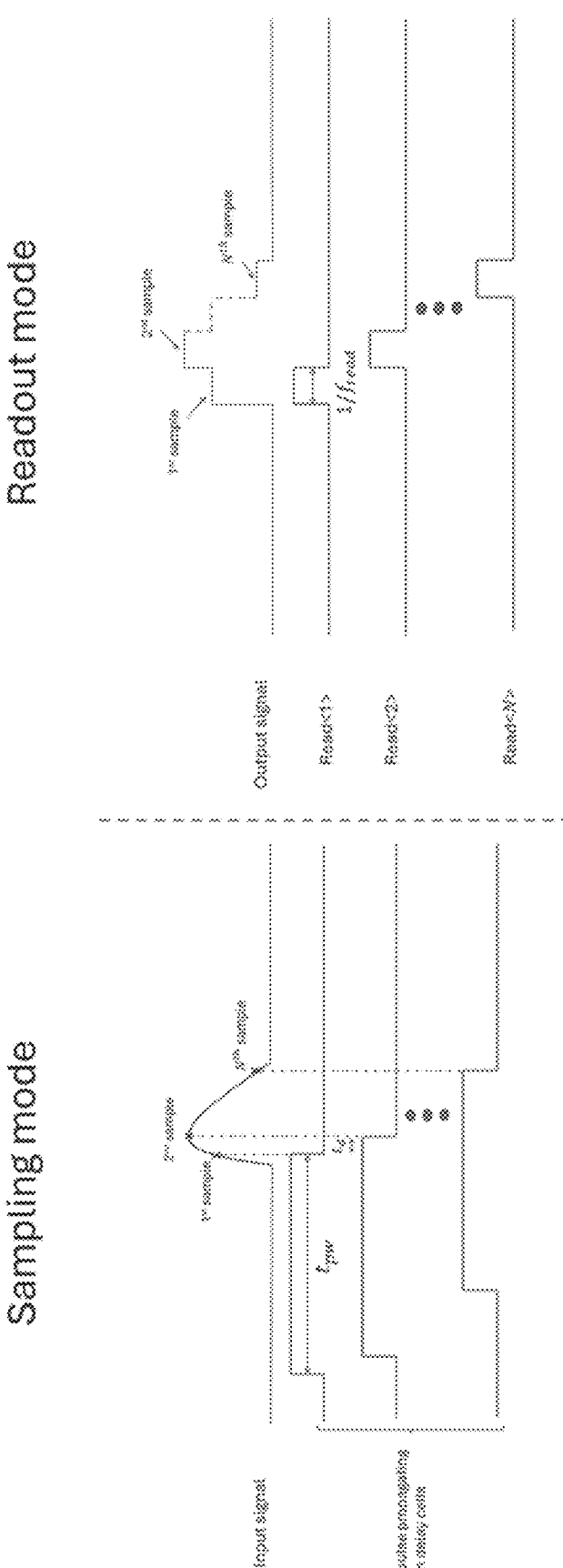
FIG. 2A depicts an example timing diagram of a sampling process of the sampling system of FIG. 1.
FIG. 2B depicts an example timing diagram of a readout process of the sampling system of FIG. 1.

The sampling system 100 can operate in two primary operation modes, which are a sampling mode and a readout mode. In the sampling mode, a clock pulse signal having a pulse width $t_{pw}$ is applied at the input of the first delay cell 104-1. The clock pulse signal sequentially propagates through the array of delay cells 104-1, . . . , 104-N, which means that the falling edge of the clock pulse signal sequentially turns off the sampling switches, S<1> to S<N>, and thus capturing the instantaneous analog values. The rate at which the signal is captured is determined by the time delay $t_d$ and the effective sampling rate can be defined as $1/t_d$ or $f_s$. This delay can also made programmable by incorporating a current starving mechanism in one of the inverters in the delay cell. Bottom plate sampling is also included to ensure distortion less sampling (not illustrated in FIG. 1). The sampling capacitor values can be optimized to minimize thermal noise (KT/C noise). The top plate of the capacitor 106-1, . . . , or 106-N is also connected to a corresponding buffer (e.g., a source follower) 108-1, . . . , or 108-N for the readout portion. The sampling mode is completed once the clock pulse signal is propagated through the entire delay cell array 104-1, . . . , 104-N. FIG. 2A depicts an example timing diagram of a sampling process of the sampling system 100 of FIG. 1. After the sampling mode is completed, the readout mode is initiated where the stored voltage values in the capacitors 106-1, . . . , 106-N are accessed through the readout switches 110-1, . . . , 110-N, which are activated in a one-hot manner where the readout switch in each sampling cell will be switched on at a time. A one hot decoder, which is clocked at $f_{read}$, can be used to generate the one hot pulses, Read<1> to Read<N>, for the readout switches 110-1, . . . , 110-N. It is noted that $f_{read} << f_s$ such that the readout portion has relaxed bandwidth requirements. The output of the readout switches 110-1, . . . , 110-N can be coupled to a final buffer to enhance drive capability. For example, the sampling system 100 can reproduce a slow or stretched version of the sampled signal while preserving the integrity of the original signal. Employing this topology in a high-speed system has many benefits. For example, after the completion of high-speed sampling, the signal readout and post processing circuits can be realized using low bandwidth requirements, which eliminates the need for high-speed ADCs and other high-speed signal processing blocks and thus reduces cost and overall power consumption. FIG. 2B depicts an example timing diagram of a readout process of the sampling system 100 of FIG. 1.

The maximum effective sampling rate that can be achieved in the sampling system 100 is mainly limited by the intrinsic delay from the inverters in the delay cells 104-1, . . . , 104-N. To address these limitations, a multi-channel sampling scheme can be used to improve the effective sampling rate, bandwidth, and overall performance and to reduce design constraints on analog blocks.

Figure 3:
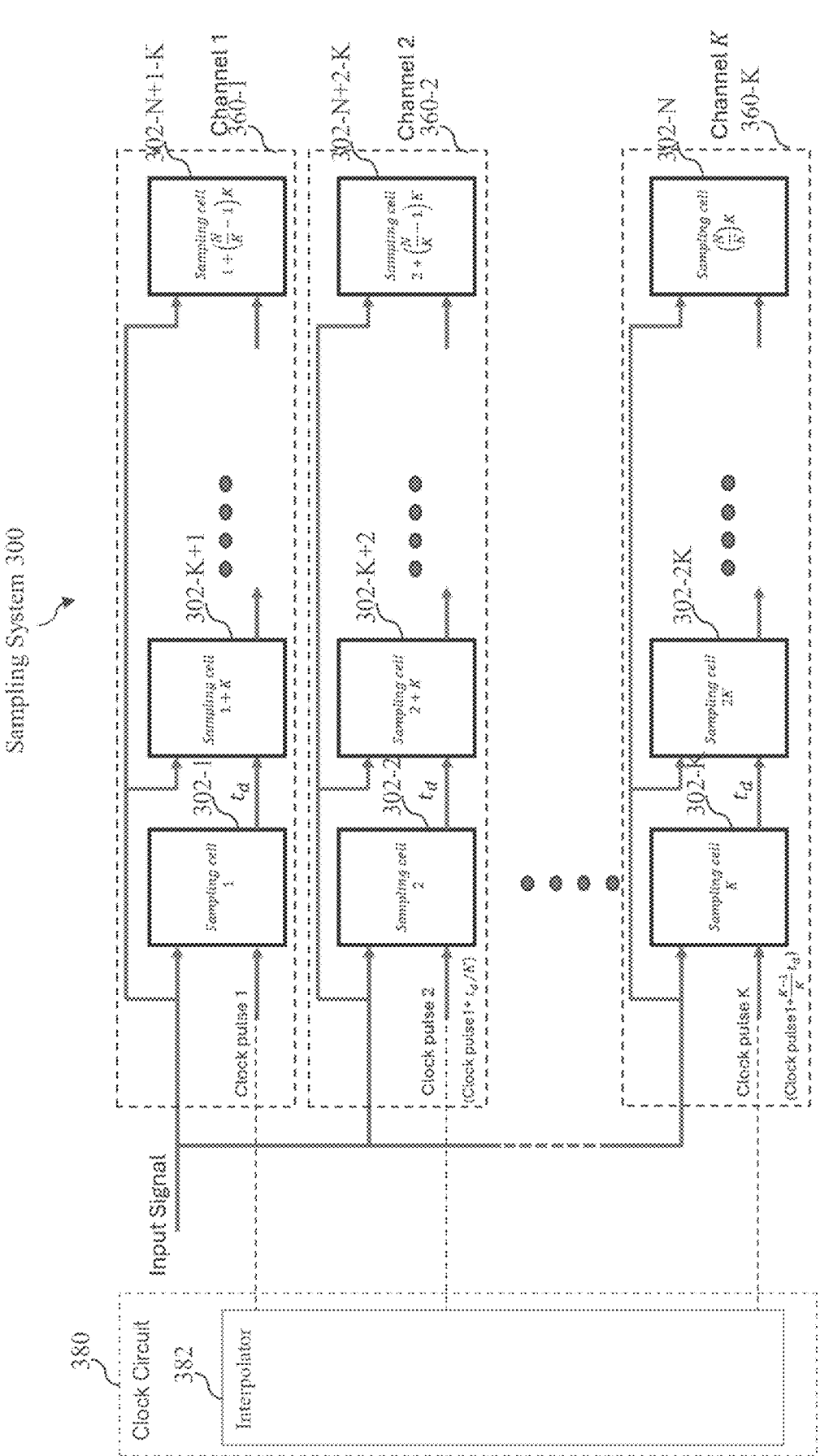
FIG. 3 depicts a multi-channel sampling system in accordance to an embodiment of the invention.

FIG. 3 depicts a multi-channel sampling system 300 in accordance to an embodiment of the invention. In the embodiment depicted in FIG. 3, the multi-channel sampling system 300 includes a sampler array with N (N being a positive integer) sampling cells 302-1, . . . , 302-N that are divided into K (K being a positive integer) number of sampling channels or banks 360-1, . . . , 360-K. The sampling cells 302-1, . . . , 302-N may be implemented in hardware (e.g., circuits), software, firmware, or a combination thereof. In some embodiments, at least one of the sampling cells 302-1, . . . , 302-N are implemented similarly to or the same as the sampling cells 102-1, . . . , 102-N of the sampling system 100 shown in FIG. 1. For example, at least one of the sampling cells 302-1, . . . , 302-N includes a sampling switch, a capacitor, a buffer, a readout switch, and a delay cell. The sampling switches can be controlled by the array of delay cells. For example, each of the sampling switches is controlled by a corresponding delay cell. In some embodiments, each of the delay cells includes inverter cells that are connected in a cascaded manner and formed by corresponding transistors, and a time delay, $t_d$, introduced by these inverters determines the delay of the delay cells. The multi-channel sampling system 300 depicted in FIG. 3 can be used to capture high-speed analog signals and reproduce the captured high-speed analog signals in a slow and stretched manner. The read-out signal can be digitized using relatively low speed ADCs. Replacing high speed ADCs with relatively low speed ADCs can significantly reduce the power consumption and cost of a high-speed signal acquisition system. The multi-channel sampling system 300 can be used in various applications, such as industrial applications, medical applications, computer applications, and/or consumer or enterprise applications. Although the illustrated multi-channel sampling system 300 is shown with certain components and described with certain functionality herein, other embodiments of the communications system may include fewer or more components to implement the same, less, or more functionality. For example, the multi-channel sampling system 300 may include a clock circuit 380 configured to generate sampling clock pulses clock pulse 1, . . . , clock pulse K with respective phase offsets for the sampling channels or banks 360-1, . . . , 360-K. In some embodiments, the clock circuit 380 includes an interpolator 382 configured to generate the respective phase offsets for the sampling clock pulses clock pulse 1, . . . , clock pulse K. In some embodiments, the interpolator 382 is configured to generate the respective phase offsets that are tunable to adjust timing delays between the sampling channels 360-1, . . . , 360-K. In another example, although the sampling cells 302-1, . . . , 302-N are shown in FIG. 3 as being connected in certain topology, the network topology of the multi-channel sampling system 300 is not limited to the topology shown in FIG. 3.

In the embodiment depicted in FIG. 3, the sampling cells 302-1, . . . 302-N are divided into K number of sampling channels or banks 360-1, . . . , 360-K, where each sampling channel 360-1, . . . , or 360-K includes N/K sampling cells and each sampling channel receives a pulse signal with a precisely controlled propagation delay/time offset of $t_d$/K. By implementing the multi-channel sampling scheme, the sampling cells 302-1, . . . , 302-N are evenly distributed across a number of sampling channels 360-1, . . . , 360-K such that each of the sampling channels contains an identical number of sampling cells. Specifically, the sampling channel 360-1 includes the sampling cells 302-1, 302-K+1, . . . , 302-N+1-K, the sampling channel 360-2 includes the sampling cells 302-2, 302-K+2, . . . , 302-N+2-K, and the sampling channel 360-K includes the sampling cells 302-K, 302-2K, . . . , 302-N.

In the embodiment depicted in FIG. 3, the clock pulse (also referred to as clock pulse 1) generated for the first sampling channel 360-1 propagates through the sampling cells $$\left\{1, [1+K], [1+2K] \; .... \; \left[1+\left(\frac{N}{K}-1\right)K\right]\right\}302-1,$$

$$302-K+1, \; ... \; , 302-N+1-K$$

with a propagation delay of $t_d$. Similarly, the K$^{th}$ sampling channel 360-K receives a clock pulse K with a propagation delay/time offset of $$\frac{K-1}{K}t_d$$

that propagates through the sampling cells $$\left\{K, 2K, 3K \; ... \; \left(\frac{N}{K}\right)K\right\}302-K, 302-2K, \; ... \; , 302-N.$$

Consequently, the clock pulse propagating through the respective sampling channel samples every K$^{th}$ sampling cell. Because the clock pulse in each sampling channel is at a precise propagation delay/time offset, a significantly higher effective sampling rate of K/$t_d$ or K*$f_s$ can be achieved while maintaining a low timing jitter. The multi-channel sampling system 300 can operate in two primary operation modes, which are a sampling mode and a readout mode.

Figure 4:
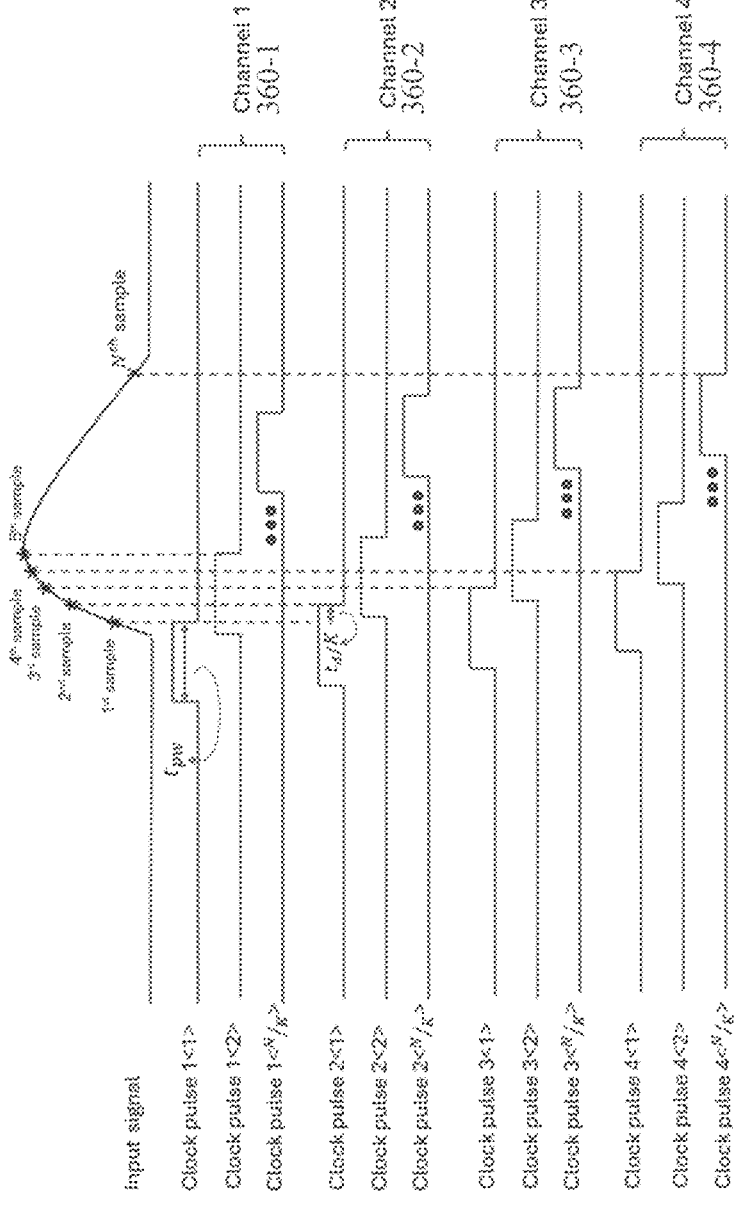
FIG. 4 illustrates an example signal timing diagram of a sampling process of the multi-channel sampling system depicted in FIG. 3.

FIG. 4 illustrates an example signal timing diagram of a sampling process of the multi-channel sampling system 300 depicted in FIG. 3. In the example signal timing diagram illustrated in FIG. 4, the number of sampling channels, K, is set to four. The clock pulse signal of pulse width $t_{pw}$ is applied to every sampling channel 360-1, . . . , or 360-4 but with a time offset of $t_d$/K. The clock pulse 1 captures samples <1, 5, 9 . . . (N−3)>. Similarly, the clock pulse 2 captures samples <2, 6, 10 . . . (N−2)>, the clock pulse 3 captures samples <3, 7, 11 . . . (N−1)>, and the clock pulse 4 captures samples <4, 8, 12 . . . (N)>.

Figure 5:
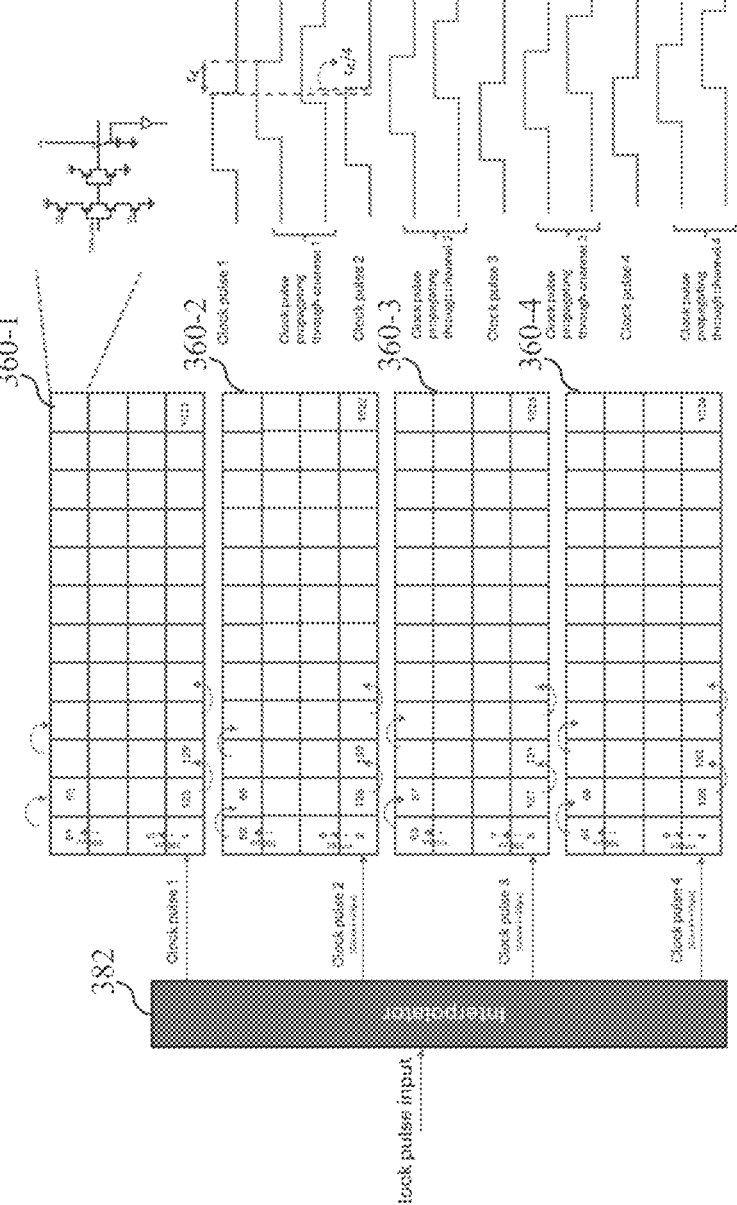
FIG. 5 illustrates an example sampling signal pattern of the multi-channel sampling system depicted in FIG. 3.

FIG. 5 illustrates an example sampling signal pattern of the multi-channel sampling system 300 depicted in FIG. 3. In the example illustrated in FIG. 5, the target effective sampling rate is 40 gigasamples per second (GS/s), the number of sampling channels, K, is set to four, and the total number of sampling cells, N, is set to 1024. In the example illustrated in FIG. 5, the interpolator 382 generates the clock pulses (clock pulse 1, clock pulse 2, clock pulse 3, clock pulse 4) based on a clock pulse input. Specifically, the clock pulse 2 has a phase/time offset of $t_d$/4 with respect to the clock pulse 1, the clock pulse 3 has a phase/time offset of $t_d$/4 with respect to the clock pulse 2, and the clock pulse 4 has a phase/time offset of $t_d$/4 with respect to the clock pulse 4. Each square in FIG. 5 corresponds to a single sampling cell 302-1, . . . , or 302-1024 that is similar to or the same as one of the sampling cells 102-1, . . . , 102-N and that can include a sampling switch, a capacitor, a delay-cell, a buffer (e.g., a source follower), and a readout switch. The clock pulse 1 captures samples <1, 5, 9 . . . 1021>. Similarly, the clock pulse 2 captures samples <2, 6, 10 . . . 1022>, the clock pulse 3 captures samples <3, 7, 11 . . . 1023>, and the clock pulse 4 captures samples <4, 8, 12 . . . 1024>. In an example, the sampling time delay, $t_d$, in each sampling channel is set to 100 picosecond (ps), while each sampling channel receives a clock pulse with a 25 ps offset, which achieves an effective sampling rate of 4/100 ps. Consequently, an effective sampling rate of K*$f_s$ is achieved while individual banks operate at a lower sampling rate of $f_s$. In some embodiments, the clock pulses for the sampling channels are generated using the clocking circuit 380, and the offset between each clock can also be made programmable by adjusting the output of the interpolator 382. In some embodiments, the sampler array in each sampling channel is arranged in such a way that the propagation of the clock pulses within each sampling channel is in a serpentine manner. Although in FIG. 5 the value of the sampling channels, K, of 4 is used, in other embodiments, other numbers of sampling channels are also possible.

Figures 6A, 6B:
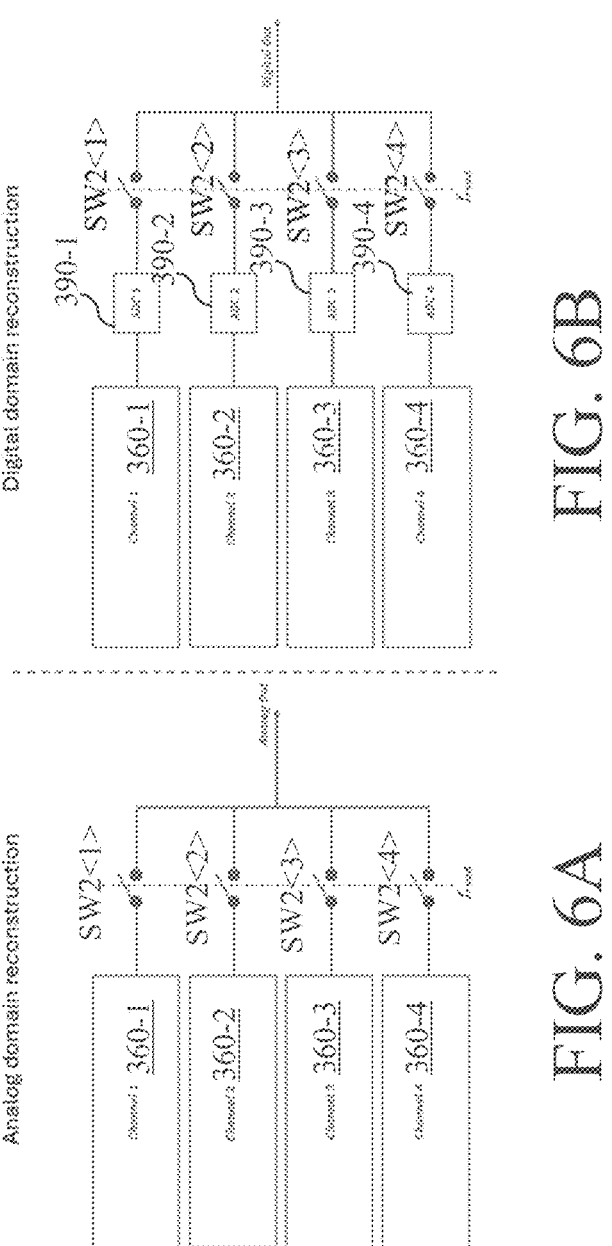
FIG. 6A illustrates an implementation of an analog domain reconstruction.
FIG. 6B illustrates an implementation of a digital domain reconstruction.

The readout operation of the multi-channel sampling system 300 depicted in FIG. 3 can be implemented in a similar fashion as the sampling system 100 depicted in FIG. 1. In an embodiment, each sampling channel 360-1, . . . , or 360-K is read out using one hot decoder. Because the sequential samples {1, 2, 3 . . . N} are spread across multiple sampling channels (as illustrated in FIG. 5), the sequential samples {1, 2, 3 . . . N} can be either reconstructed or re-arranged in digital domain or in analog domain. Reconstruction in digital domain is generally preferred as there the digitized data has lower noise and better linearity. FIG. 6A illustrates an implementation of an analog domain reconstruction and FIG. 6B illustrates an implementation of a digital domain reconstruction. In FIGS. 6A and 6B, there is an additional switch, SW2<1:4>, controlled by a read signal $f_{read}$ and connected to the output of each sampling channel 360-1, . . . , or 360-4 to re-arrange the samples. In FIG. 6A, and the switches SW2<1>, SW2<2>, SW2<3>, SW2<4> output an analog data output. In FIG. 6B, ADCs 390-1, 390-2, 390-3, 390-4 are used to perform analog-to-digital conversions and the switches SW2<1>, SW2<2>, SW2<3>, SW2<4> output a digital data output.

Figure 7:
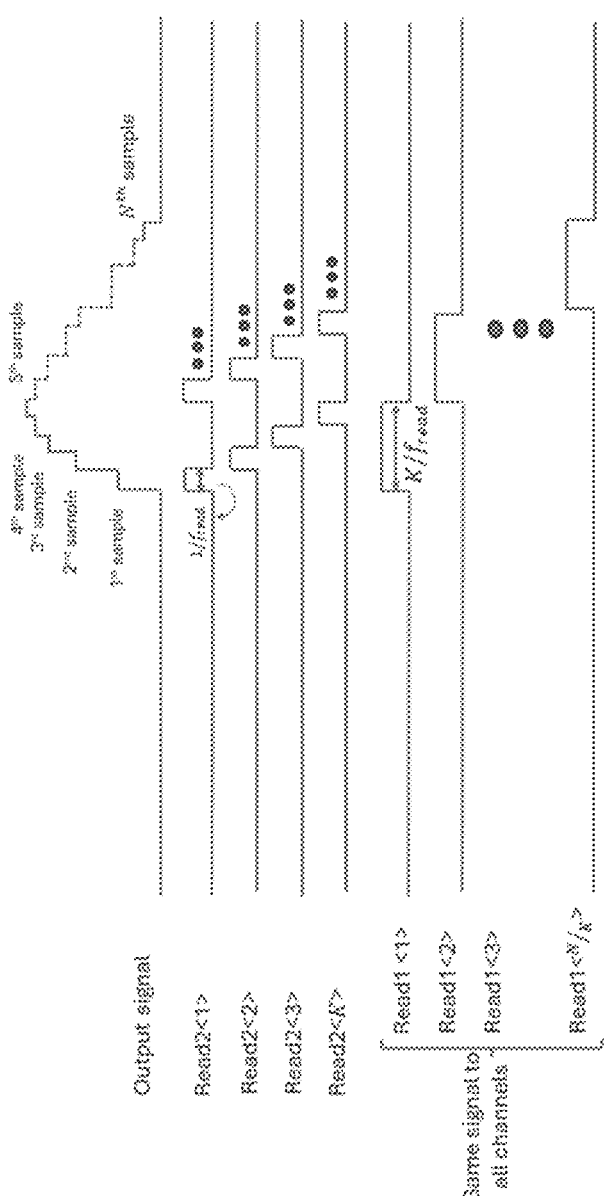
FIG. 7 illustrates an example signal timing diagram of a readout process of the multi-channel sampling system depicted in FIG. 3.

FIG. 7 illustrates an example signal timing diagram of a readout process of the multi-channel sampling system 300 depicted in FIG. 3. Even though not illustrated in FIG. 3, every sampling cell 302-1, . . . , or 302-N includes a readout switch, SW1, to read the sampled signal. Moreover, there is also an additional switch, SW2<1: K>, connected to the output of each sampling channel 360-1, . . . , or 360-K to re-arrange the samples (illustrated in FIG. 6A and FIG. 6B). The one hot readout signals, Readi<1: N/K>, (as shown in FIG. 1 and FIG. 2B) are identical for every sampling channel and thus the sampled data is read out in parallel manner. The K parallel outputs are multiplexed and re-arranged into a single output using SW2 switches SW2<1: K> and Read2<1:K> signals. Read2 signals operate at a period of $1/f_{read}$, while Read1 signals operate at a period of K/$f_{read}$. As shown in FIG. 7, $f_{read} \ll f_s$ such that the readout portion has relaxed bandwidth requirements.

Figure 8:
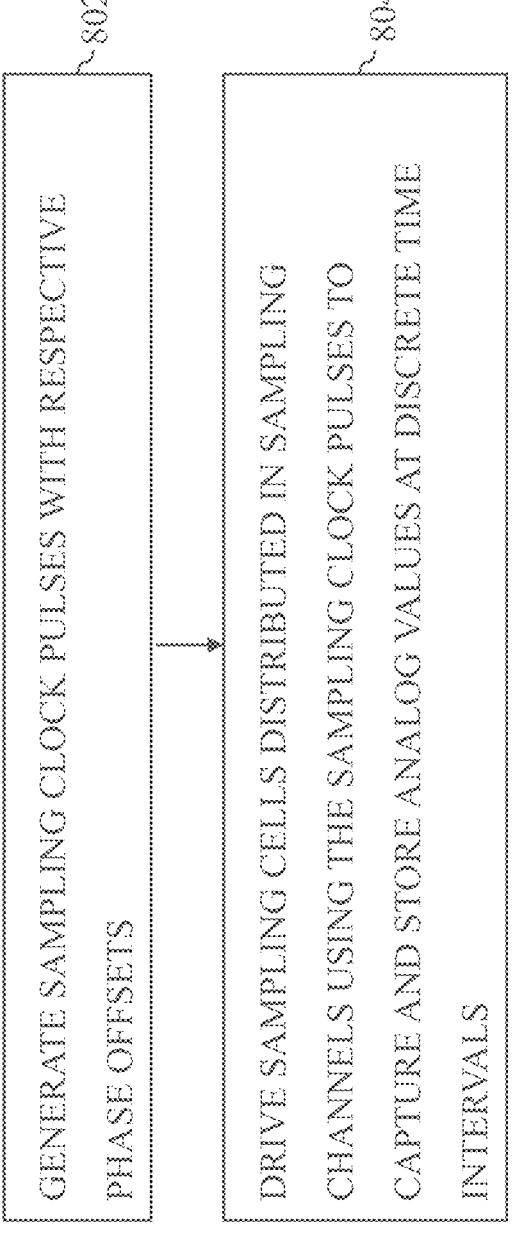
FIG. 8 is a process flow diagram of a method for sampling in accordance to an embodiment of the invention.

FIG. 8 is a process flow diagram of a method for sampling in accordance to an embodiment of the invention. According to the method, at block 802, sampling clock pulses with respective phase offsets are generated. At block 804, sampling cells distributed in sampling channels are driven using the sampling clock pulses to capture and store analog values at discrete time intervals. The sampling cells may be similar to, the same as, or a component of the sampling cells 102-1, . . . , 102-N depicted in FIG. 1 and/or the sampling cells 302-1, . . . , 302-N depicted in FIG. 3. The sampling channels may be similar to, the same as, or a component of the sampling channels 360-1, . . . , 360-K depicted in FIG. 3.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A sampling system, the sampling system comprising:
a plurality of sampling cells,
wherein the sampling cells are distributed into a plurality of sampling channels,
wherein the sampling cells in the sampling channels are driven by a plurality of sampling clock pulses with a plurality of respective phase offsets; and
a clock circuit configured to generate the sampling clock pulses with the respective phase offsets, wherein the clock circuit comprises an interpolator configured to generate the respective phase offsets for the sampling clock pulses.

2. The sampling system of claim 1, wherein the sampling cells are evenly distributed into the sampling channels, and wherein each of the sampling channels contains an identical number of sampling cells.

3. The sampling system of claim 1, wherein all sampling cells in each of the sampling channels are driven by a sampling clock pulse with a specific phase offset of the sampling clock pulses.

4. The sampling system of claim 1, wherein the sampling cells are configured to capture and store a plurality of analog values at a plurality of discrete time intervals.

5. The sampling system of claim 1, wherein one of the sampling cells comprises a sampling switch, a capacitor, a buffer, a readout switch, and a delay cell.

6. The sampling system of claim 1, wherein each of the sampling cells comprises a sampling switch, a capacitor, a buffer, a readout switch, and a delay cell.

7. The sampling system of claim 6, wherein the sampling switch and the capacitor are configured to capture and store analog data, and wherein the readout switch and the buffer are configured to read the stored analog data.

8. The sampling system of claim 6, wherein the delay cells in all sampling cells in each of the sampling channels are configured to propagate one of the sampling clock pulses sequentially.

9. The sampling system of claim 1, wherein each of the sampling cells is configured to operate in one of a sampling mode and a readout mode.

10. The sampling system of claim 1, wherein data that is read out from the sampling channels is sequentially arranged in one of an analog domain and a digital domain.

11. The sampling system of claim 1, wherein the interpolator is further configured to generate the respective phase offsets that are tunable to adjust a plurality of timing delays between the sampling channels.

12. A multi-channel sampling system, the multi-channel sampling system comprising:

a plurality of sampling cells, wherein the sampling cells are evenly distributed into a plurality of sampling channels such that each of the sampling channels contains an identical number of sampling cells, and wherein the sampling cells in the sampling channels are driven by a plurality of sampling clock pulses with a plurality of respective phase offsets; and a clock circuit configured to generate the sampling clock pulses with the respective phase offsets, wherein all sampling cells in each of the sampling channels are driven by a sampling clock pulse with a specific phase offset of the sampling clock pulses, and wherein the clock circuit comprises an interpolator configured to generate the respective phase offsets for the sampling clock pulses that are tunable to adjust a plurality of timing delays between the sampling channels.

13. The multi-channel sampling system of claim 12, wherein the sampling cells are configured to capture and store a plurality of analog values at a plurality of discrete time intervals.

14. The multi-channel sampling system of claim 12, wherein each of the sampling cells comprises a sampling switch, a capacitor, a buffer, a readout switch, and a delay cell.

15. The multi-channel sampling system of claim 14, wherein the sampling switch and the capacitor are configured to capture and store analog data, and wherein the readout switch and the buffer are configured to read the stored analog data.

16. The multi-channel sampling system of claim 12, wherein data that is read out from the sampling channels is sequentially arranged in one of an analog domain and a digital domain.

17. A method for sampling, the method comprising:

using a clock circuit, generating a plurality of sampling clock pulses with a plurality of respective phase offsets, wherein using the clock circuit, generating the sampling clock pulses with the respective phase offsets comprises using an interpolator of the clock circuit, generating the respective phase offsets for the sampling clock pulses; and driving a plurality of sampling cells distributed in a plurality of sampling channels using the sampling clock pulses to capture and store a plurality of analog values at a plurality of discrete time intervals.

18. A sampling system, the sampling system comprising:

a plurality of sampling cells, wherein the sampling cells are distributed into a plurality of sampling channels, wherein the sampling cells in the sampling channels are driven by a plurality of sampling clock pulses with a plurality of respective phase offsets, wherein each of the sampling cells comprises a sampling switch, a capacitor, a buffer, a readout switch, and a delay cell, and wherein the sampling switch and the capacitor are configured to capture and store analog data, and wherein the readout switch and the buffer are configured to read the stored analog data.

19. A multi-channel sampling system, the multi-channel sampling system comprising:

a plurality of sampling cells, wherein the sampling cells are evenly distributed into a plurality of sampling channels such that each of the sampling channels contains an identical number of sampling cells, and wherein the sampling cells in the sampling channels are driven by a plurality of sampling clock pulses with a plurality of respective phase offsets; and a clock circuit configured to generate the sampling clock pulses with the respective phase offsets, wherein all sampling cells in each of the sampling channels are driven by a sampling clock pulse with a specific phase offset of the sampling clock pulses, wherein each of the sampling cells comprises a sampling switch, a capacitor, a buffer, a readout switch, and a delay cell, wherein the sampling switch and the capacitor are configured to capture and store analog data, and wherein the readout switch and the buffer are configured to read the stored analog data.

* * * * *